United States Patent [19]

Morinaga et al.

[11] Patent Number: 4,862,474
[45] Date of Patent: Aug. 29, 1989

[54] SEMICONDUTOR LASER DEVICE

[75] Inventors: Motoyasu Morinaga, Yokohama; Hideto Furuyama, Tokyo; Masaru Nakamura, Kawaguchi; Nobuo Suzuki, Tokyo; Yuzo Hirayama; Hajime Okuda, both of Yokohama, all of Japan

[73] Assignee: Kabushiki Kaisha Toshiba, Kawasaki, Japan

[21] Appl. No.: 198,866

[22] Filed: May 26, 1988

[30] Foreign Application Priority Data

| May 26, 1987 | [JP] | Japan | 62-126944 |
| Aug. 19, 1987 | [JP] | Japan | 62-204223 |
| Sep. 28, 1987 | [JP] | Japan | 62-240845 |

[51] Int. Cl.⁴ .................................................. H01S 3/19
[52] U.S. Cl. ......................................... 372/50; 372/46; 357/41
[58] Field of Search ............... 372/45, 46, 50; 357/40, 357/41

[56] References Cited

U.S. PATENT DOCUMENTS

| 4,361,887 | 11/1982 | Nakamura et al. | 372/50 |
| 4,366,567 | 12/1982 | Fukuzawa et al. | 372/38 |
| 4,468,850 | 9/1984 | Liau et al. | 29/569 |
| 4,608,696 | 8/1986 | Law et al. | 372/50 |
| 4,662,988 | 5/1987 | Renner | 372/43 |
| 4,692,926 | 9/1987 | Marschall et al. | 372/46 |
| 4,719,498 | 1/1988 | Wada et al. | 372/50 |
| 4,725,112 | 2/1988 | Bridges et al. | 372/46 |
| 4,777,516 | 10/1988 | Deschler et al. | 372/50 |

FOREIGN PATENT DOCUMENTS 0208209 1/1987 European Pat. Off.
3713133 11/1988 Fed. Rep. of Germany.

OTHER PUBLICATIONS

Wada et al, IEEE Journal of Quantum Electronics, vol. OE-22, No. 6, Jun. 1986, pp. 805-821, IEEE, New York, Wada et al., "Recent Progress in Optoelectronic Integrated Circuits".

Koch et al, Electronic Letters, vol. 20, No. 21, Oct. 11, 1984, pp. 856-857.

Koch et al, "Low-Threshold High-Speed 1.55 mum Vapour Phase Transported Buried Heterostructure Lasers".

Patent Abstracts of Japan, vol. 11, No. 46 (E-479) [2493], Feb. 12, 1987.

Primary Examiner—James W. Davie
Attorney, Agent, or Firm—Oblon, Spivak, McClelland, Maier & Neustadt

[57] ABSTRACT

A semiconductor laser device comprises a substrate having an n-type buffer layer, a semiconductor laser element and auxiliary element, provided side by side on the buffer layer. The semiconductor laser element includes a mesa portion having a p-type low resistant semiconductor region provided above the buffer layer, an active region consisting of a semiconductor formed on the buffer layer and low resistant region, a pair of buried portions integrally formed with the low resistive region and formed on and contiguous to opposite sides of the active region in the width direction. A lateral hole is provided between the buffer layer and low resistive region on the side of buried portion. The auxiliary element includes a high resistive regions integrally formed with the low resistant region and positioned on the sides of low resistive region.

9 Claims, 21 Drawing Sheets

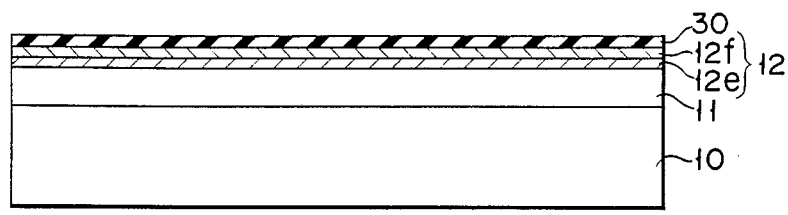
F I G. 2A
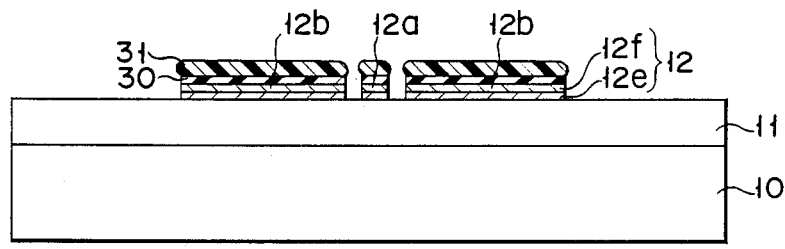
F I G. 2B
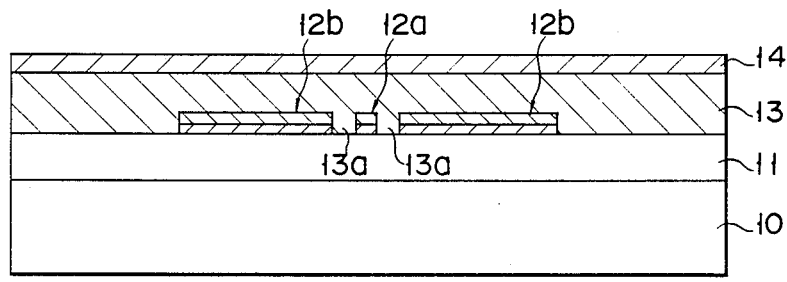
F I G. 2C

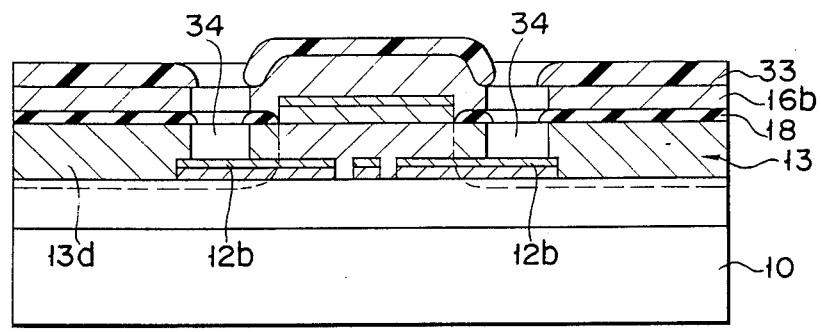
F I G. 2G
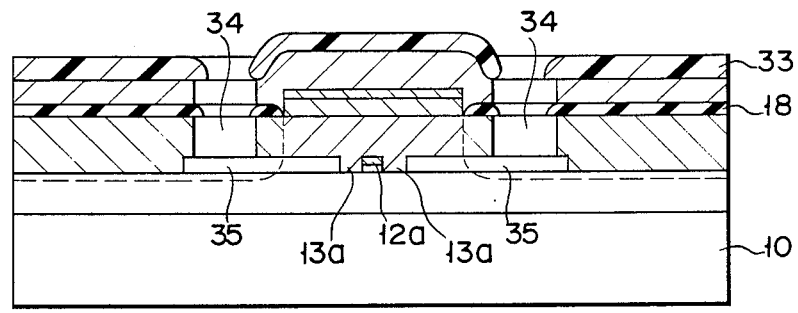
F I G. 2H
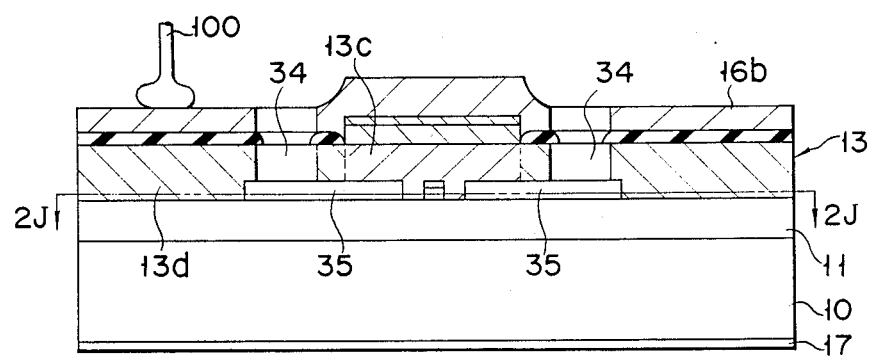
F I G. 2I

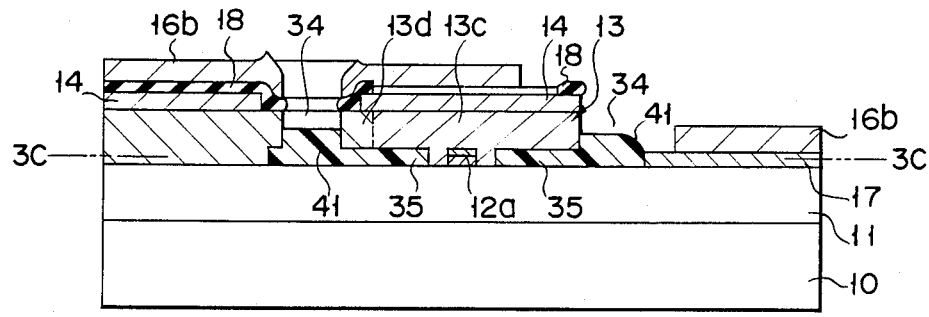
F I G. 3A
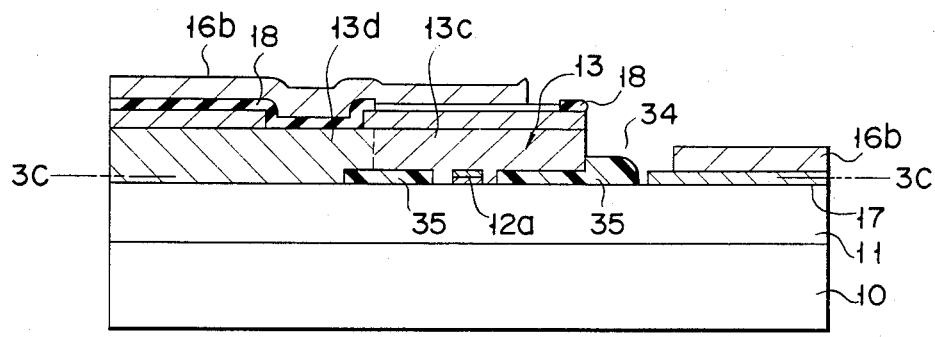
F I G. 3B

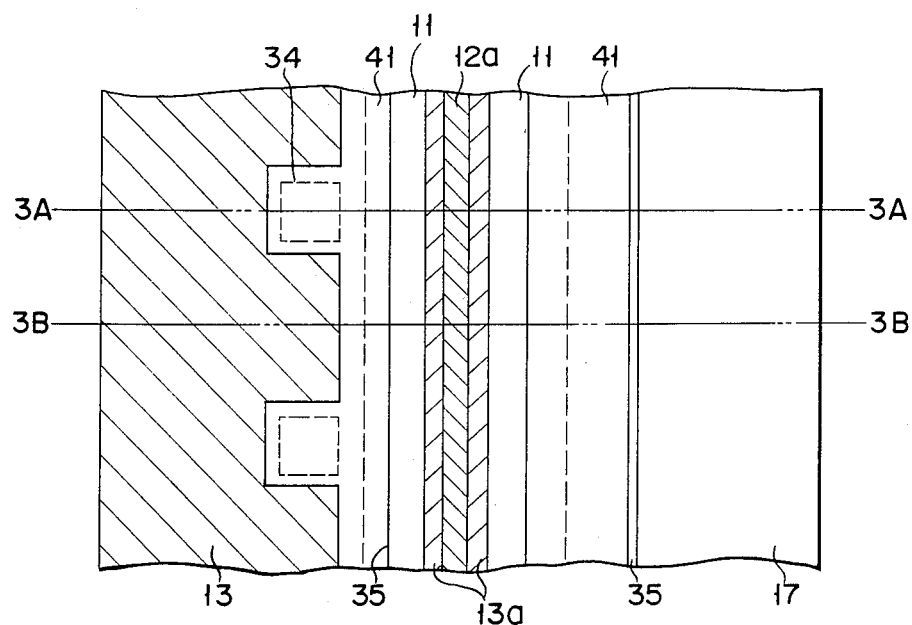
F I G. 3C
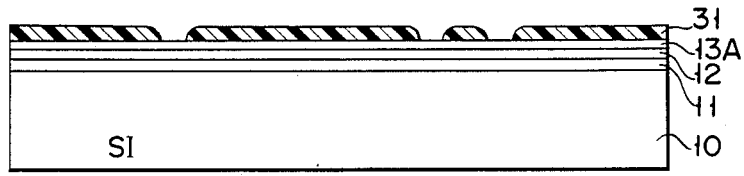
F I G. 4A
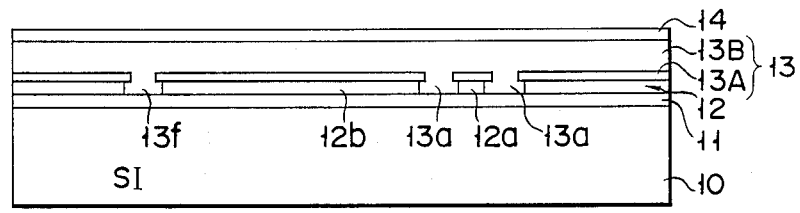
F I G. 4B

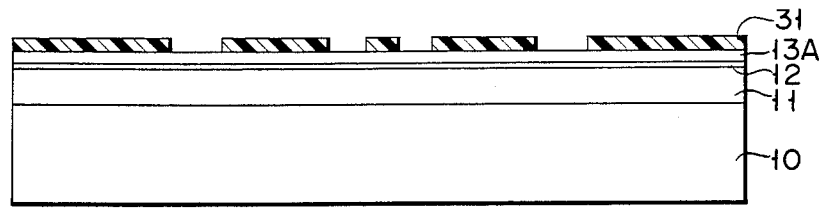
F I G. 11A
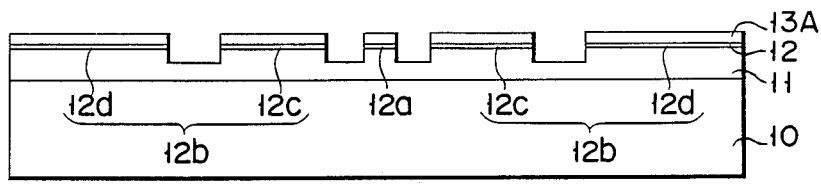
F I G. 11B
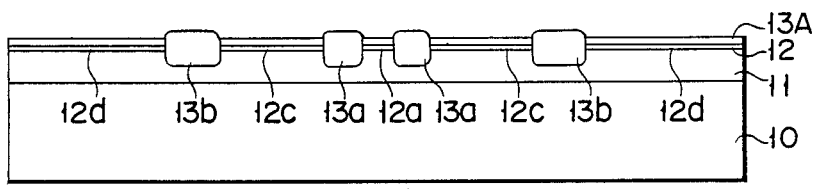
F I G. 11C
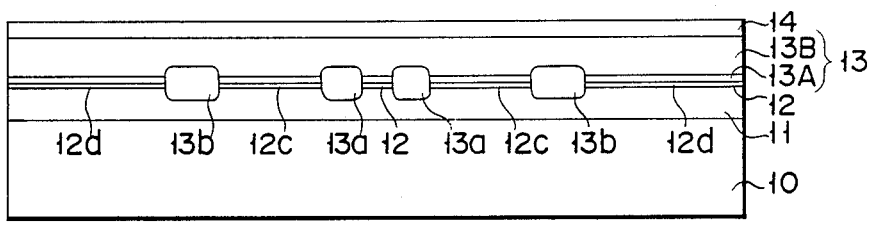
F I G. 11D

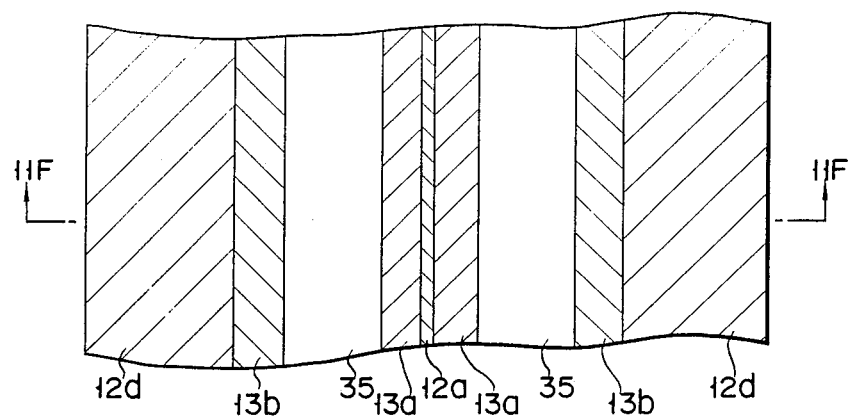
F I G. 11G
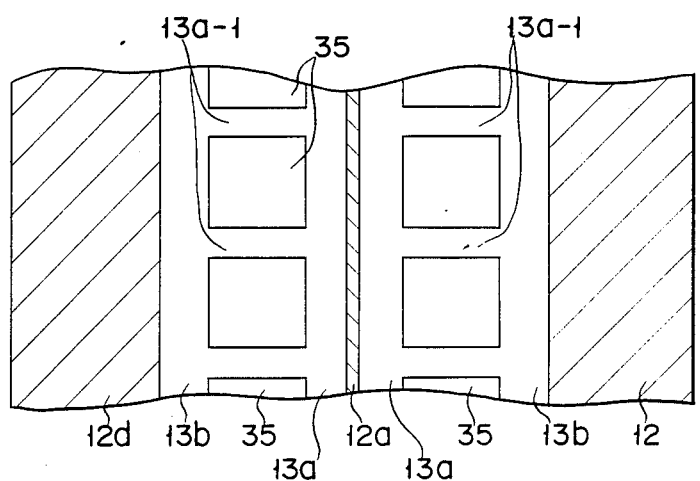
F I G. 12

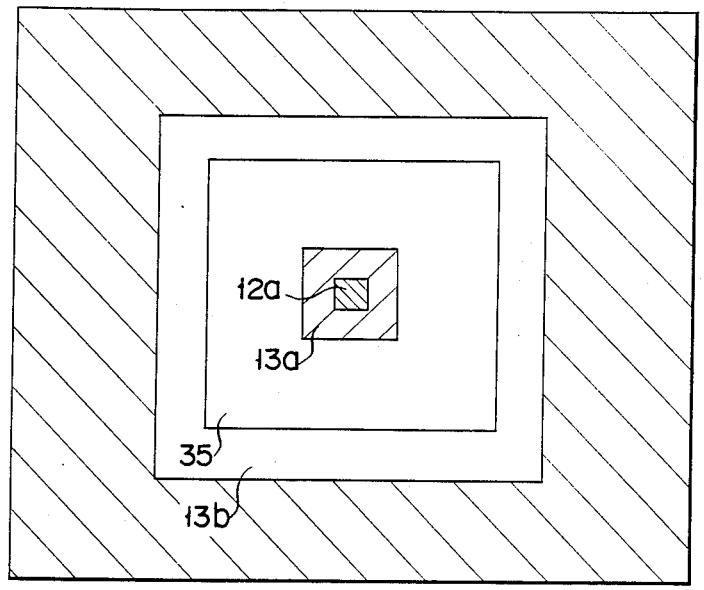
F I G. 13
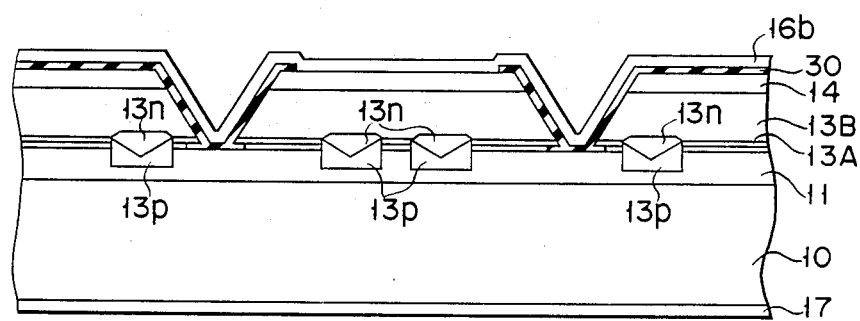
F I G. 14

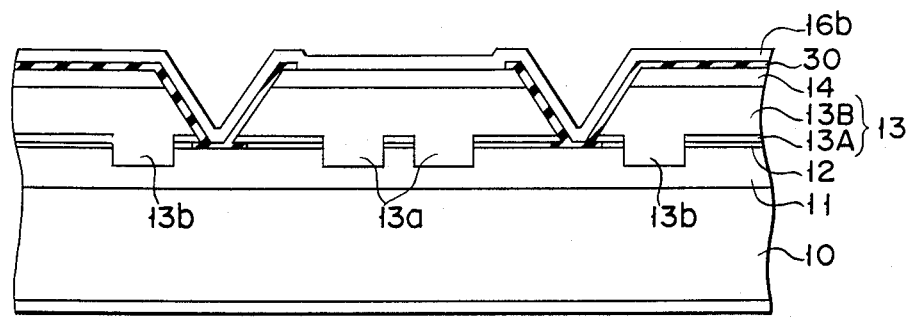
F I G. 15
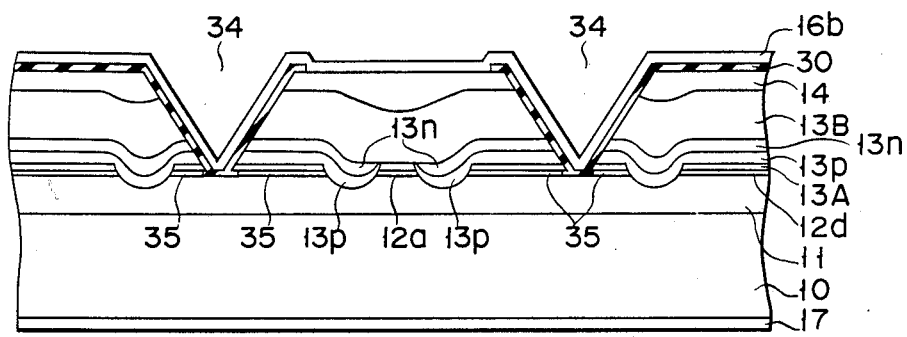
F I G. 16
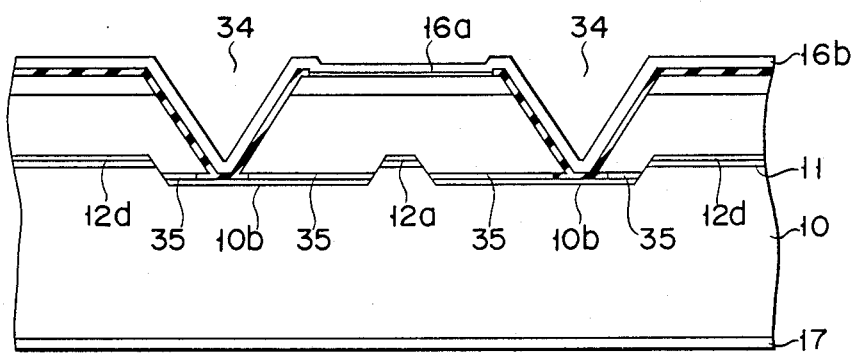
F I G. 17

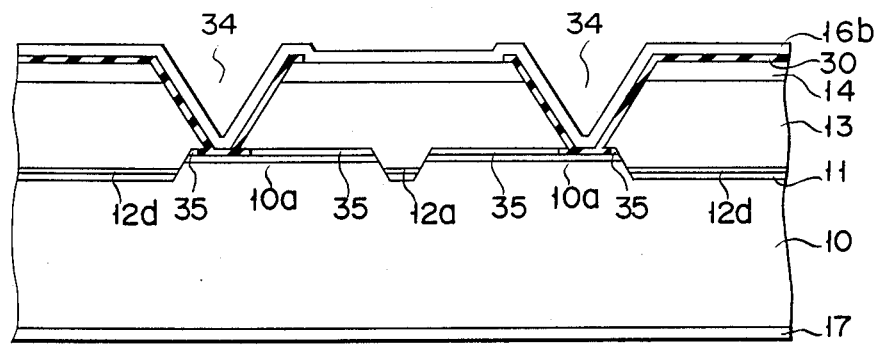
F I G. 18
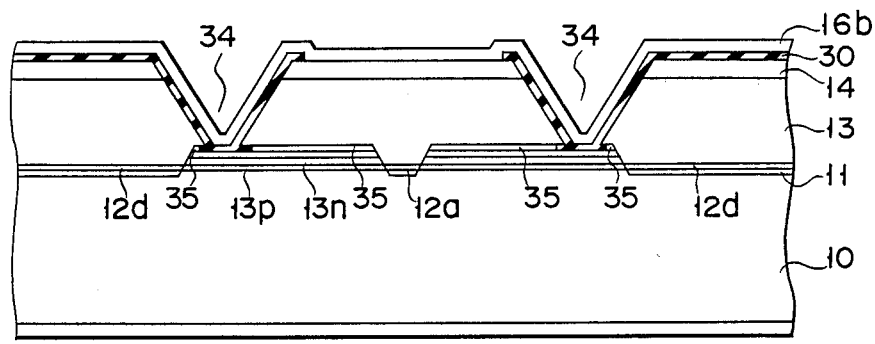
F I G. 19
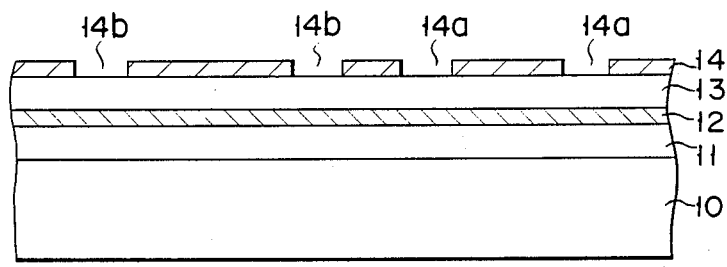
F I G. 20A

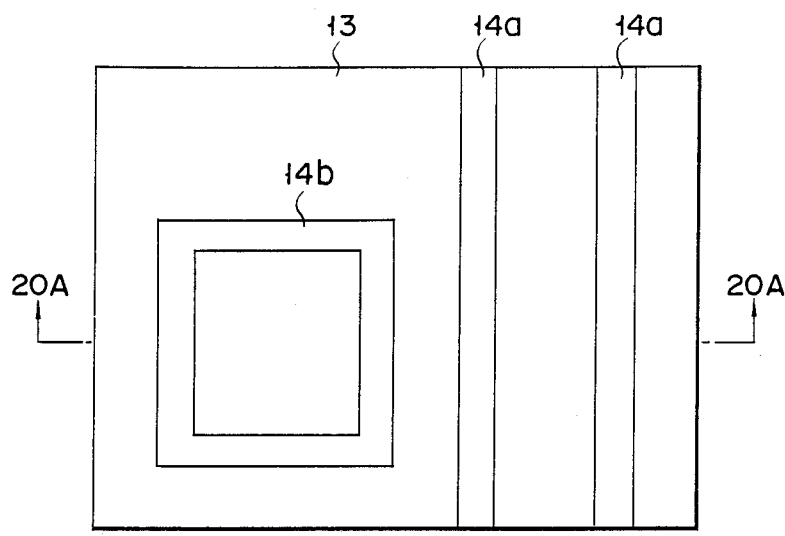
F I G. 20B
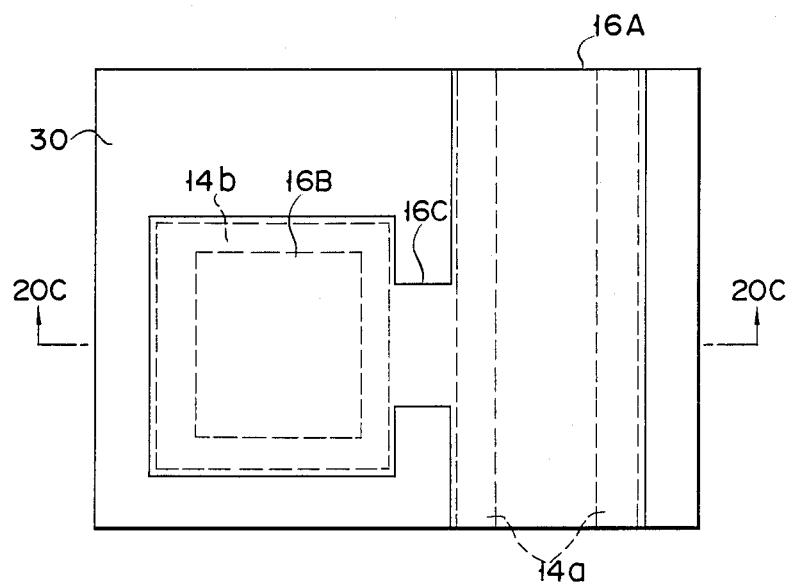
F I G. 20D

SEMICONDUTOR LASER DEVICE

BACKGROUND OF THE INVENTION

1. Field of the Invention

This invention relates to a semiconductor light-emitting device such as a refractive index waveguide laser or a double heterojunction light-emitting diode and a method of manufacturing the same and, more particularly, to a semiconductor light-emitting device, in which an active region is surrounded by a semiconductor layer whose forbidden band width is larger than that of the active region, wherein the active region has opposed edge surfaces serving as reflecting mirrors for oscillating a laser beam between the opposed edge surfaces and emitting the laser beam from one of the edge surfaces, and a method of manufacturing the same.

2. Description of the Related Art

Recently, various semiconductor light-emitting devices having a double heterostructure have been developed. In the semiconductor light-emitting devices of this type, it is very important to satisfy the following conditions A to C.

A. Current should be efficiently concentrated to only a light-emitting region or active region with the size thereof controlled to a very small value for improving the light-emitting efficiency.

B. Electrodes covering wide regions have to be formed to reduce the contact resistance.

C. Where high-speed modulation is required as in a light-emitting device, the area of a p-n junction should be minimized to reduce the junction capacitance.

As a well-known semiconductor light-emitting device for optical communication which more or less satisfies the above three conditions, there is a messa laser utilizing a mass transport technique (e.g., Y. Hirayama et al. "Low Temperature and Rapid Mass Transport Technique for GaInAsP/InP DFB Lasers", Inst. Phys. Conf. Ser. No. 79: Chapt. 3, Paper presented at Int. Symp. GaAs and Related Compounds, Karuizawa, Japan, 1985, p. 175,186). Such a semi- light-emitting device is called an MT laser. A method of manufacture and characteristics of the MT laser will be described below with reference to the accompanying drawings.

FIGS. 1A to 1D are sectional views schematically showing steps of manufacture of a prior art MT laser. As shown in FIG. 1A, on n-type (100) InP substrate 1 are sequentially crystal-grown approximately 3-$\mu$m thick n-type InP buffer layer 2, 0.1-$\mu$m thick undoped GaInAsP active layer 3 which has a composition enabling emission of light having a wavelength of 1.3 $\mu$m, 1.5-$\mu$m thick p-type InP clad layer 4 and 0.8-$\mu$m thick p-type GaInAsP cap layer 5 which enables satisfactory ohmic contact and emits light having a wavelength of 1.15 $\mu$m.

Then, as shown in FIG. 1B, the wafer is selectively etched until active layer 3 is exposed, thus forming a mesa stripe having a width of 15 $\mu$m, a size permitting comparatively ready masking. The GaInAsP layer 5 may be etched by means of etchant composed of sulfric acid, hydrogen peroxide and water (4:1:1). At this time, by using hydrochloric acid for the removal of p-type InP layer 4, the etching can be automatically stopped at active layer 3 owing to the selectivity of the acid.

Subsequently, as shown in FIG. 1C, both sides of active layer 3 are etched with an etchant composed of sulfric acid, hydrogen peroxide and water (in proportions of 4:1:1) to form an active region having a width of about 1 $\mu$m. At this time, InP is substantially not etched, and only GaInAsP which is a four-element mixed crystal is etched. Cap layer 5 is etched to a depth only about one-third of that of active layer 3 due to a difference in composition. In order to obtain stable fundamental transverse oscillation and low oscillation threshold current, the width of active layer 3 has to be controlled accurately to around 1 $\mu$m.

Then, as shown in FIG. 1D, an InP layer is buried in the deep gap of active layer 3, having been formed by etching, to obtain a so-called buried heterostructure (BH) from considerations of light leakage of a proper amount in transversal mode and mechanical strength. In the MT laser, an MT process is used for the growth of the burried InP layer. In other words, use is made of a phenomenon that by doping phosphorus at a high temperature (670° C.) and under a high pressure, InP is grown preferentially in the gap. InP can be grown more rapidly and at a lower temperature by using $InCl_3$ as additive.

$SiO_2$ film 6 is then formed over the entire top surface of the element as an insulating film, and a window is formed in a contact portion of this film. AuZn is then formed as p-side electrode 7 by a lift-off process and is then heated for alloying. Electrode 8 is then formed by deposition of Au-Cr on electrode 7 and insulating film 8. Further, n-side electrode 9 is formed on substrate 1, thus completing the MT laser.

With this MT laser, current can be concentrated in active region 3 by a built-in potential difference between GaInAsP of active region 3 and InP of the buried layer. In addition, since a junction is formed only in the mesa portion, the junction capacitance is low and, therefore, high-speed response can be obtained advantageously. Further, electrode 7 may be formed with its width of about 10 $\mu$m.

This MT layer, however, has a problem in the controllability of the width of the active region. When the active region having a width of 15 $\mu$m is selectively etched from its opposite ends for the formation of the active region with a width of about 1 $\mu$m, it is difficult to stop the etching accurately to obtain a dimension of 1 $\mu$m, and sometimes the entire active region is etched, thus deteriorating the yield of manufacture. The accuracy of etching is deteriorated with increase of the width of the mesa. For this reason, the mesa width can not be increased beyond 15 $\mu$m. From this consideration and also from the consideration of the mask alignment margin, the mesa width of the ohmic electrode should be set to 10 $\mu$m or less. Further, the mesa width imposes a lower limit on the area of the InP junction of the buried portion.

It is possible to control the area of the buried portion by controlling the time of the MT step. However, the controllability is very inferior. Therefore, the width of the buried InP junction portion can not be optionally reduced to reduce the junction capacitance while allowing light leakage in the transversal mode. This has been a great barrier for the realization of high performance. In the mean time, in order to reduce the junction capacitance and hence increase the rise voltage in the junction portion to reduce current leakage and increase the output, the carrier density of the buried junction portion should be optimized. However, in the existing MT process the carrier density is not controlled, so that the carrier density of the junction portion can not be prescribed. This poses serious problems in the design.

As described above, with the prior art MT process it is difficult to set the width of the active region accurately, which constitutes a great obstruction to the realization of a buried type semiconductor light-emitting device having high performance. Further, by reducing the area of the buried portion, the contact area is reduced to increase the contact resistance. On the other hand, by increasing the contact area, the area of the buried portion is increased to increase the junction capacitance and make it more difficult to control the width of the active region.

Moreover, the semiconductor laser device which is fabricated by the MT process has poor versatility and dictates cumbersome widing if it is to be combined for use with other auxiliary elements or passive elements such as transistors.

SUMMARY OF THE INVENTION

An object of the invention is to provide a semiconductor laser device, which permits control of the width of the active region with satisfactory controllability, permits optimization of the junction area of the buried portion, carrier density, etc,. permits reduction of the contact resistance, permits high-speed modulation, has high performance and is satisfactorily combined with a passive element or like auxiliary element.

BRIEF DESCRIPTION OF THE DRAWINGS

FIGS. 2A to 2K are sectional views showing sequential steps of a first embodiment of the method of manufacturing a semiconductor laser device according to the invention, with FIGS. 2I and 2K being sections taken along lines 2I—2I and 2K—2K, respectively, in FIG. 2J and showing a completed semiconductor layer device and FIG. 2J being a section taken along line 2J—2J in FIGS. 2I and 2K;

FIGS. 3A to 3C are sectional views showing a second embodiment of the semiconductor laser device according to the invention, with FIGS. 3A and 3B being sections taken along lines 3A—3A and 3B—3B, respectively, in FIG. 3C and FIG. 3C being a section taken along line 3C—3C in FIG. 3B;

FIGS. 4A to 4D are sectional views showing a third embodiment of the method of manufacturing a semiconductor laser device according to the invention;

FIGS. 11A to 11G are sectional views showing sequential steps of a tenth embodiment of the method of manufacturing a semiconductor laser device according to the invention, with FIG. 11F being a section taken along line 11F—11F in FIG. 11G and FIG. 11G being a section taken along line 11G—11G in FIG. 11F;

FIGS. 12 and 13 are sectional views similar to FIG. 11G but showing eleventh and twelfth embodiments, respectively;

FIGS. 14 to 19 are sectional views showing thirteenth to eighteenth embodiments respectively; and FIGS. 20A to 20K are sectional views showing sequential steps of an example of taking out electrodes of a semiconductor laser device according to the invention, with FIG. 20A being a section taken along line 20A—20A in FIG. 20B and FIG. 20C being a section taken along line 20C—20C in FIG. 20D.

DETAILED DESCRIPTION OF THE PREFERRED EMBODIMENTS

Figure 1A:
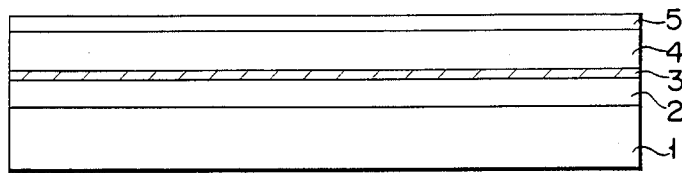
FIGS. 1A to 1D are sectional views showing sequential steps of a prior art method of manufacturing a semiconductor laser device.
Figure 1B:
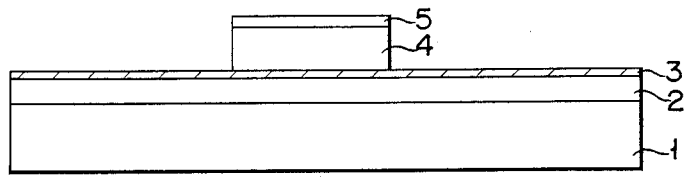
Figure 1C:
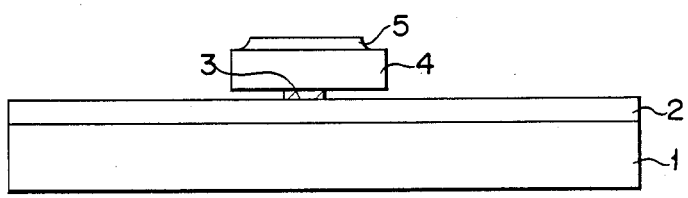
Figure 1D:
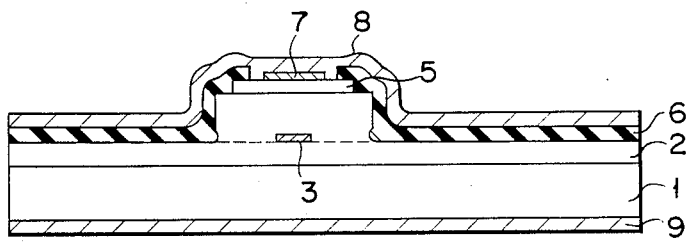

Embodiments of the invention will be described below with reference to the accompanying drawings. In the embodiments, substantially like parts or members having like function are designated by like reference numerals, and their duplicated description will be omitted.

Figure 2D:
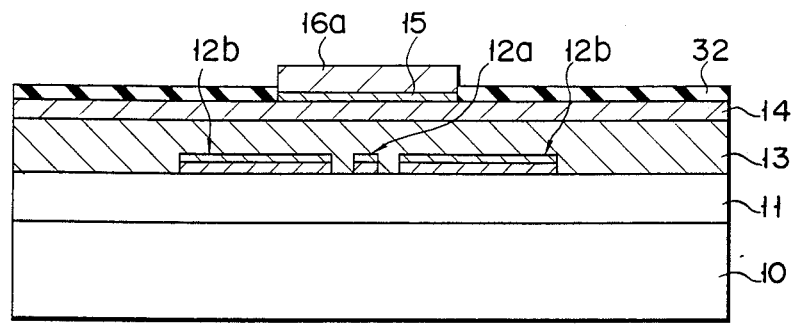
Figure 2E:
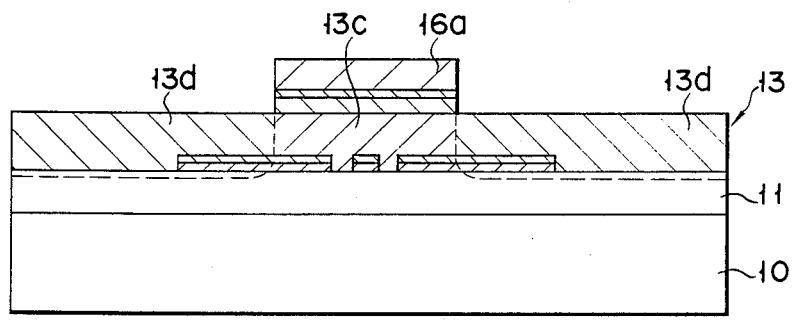
Figure 2F:
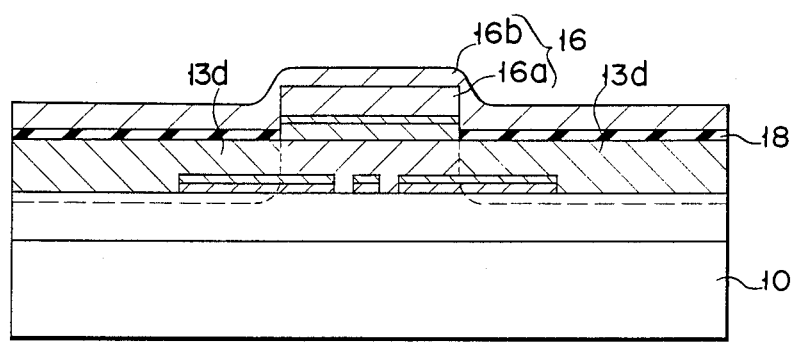
Figure 2J:
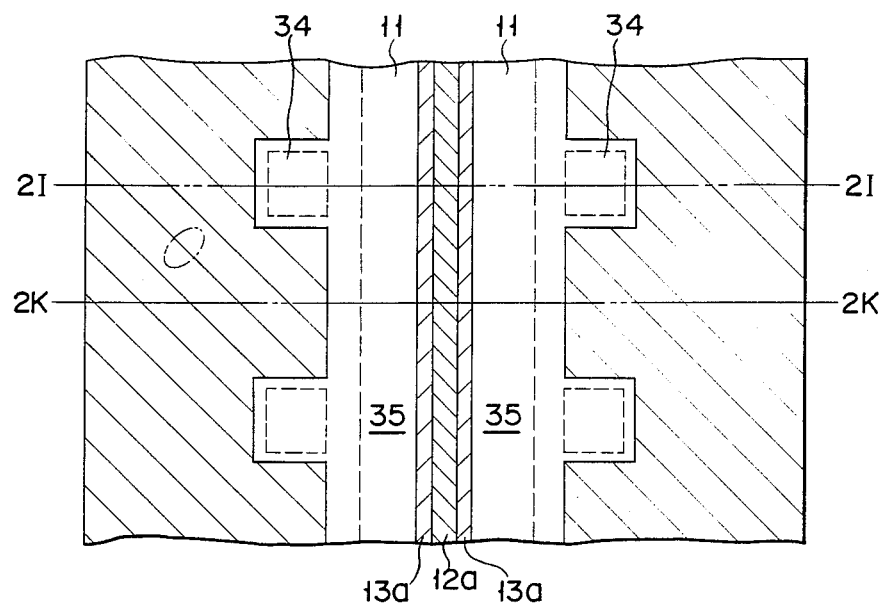
Figure 2K:
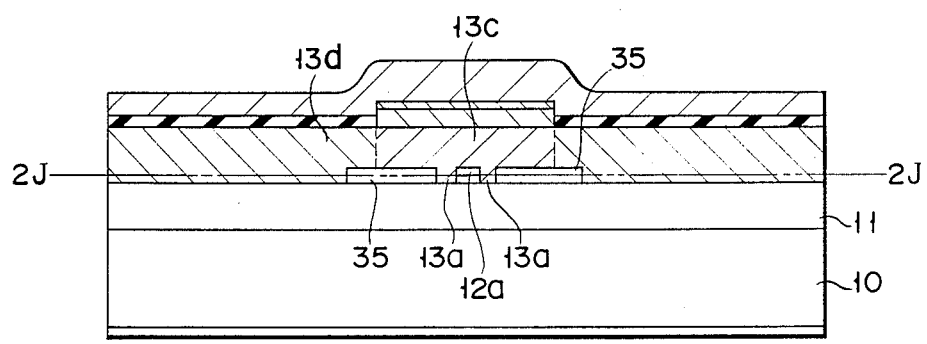

FIGS. 2A to 2K are sectional views showing sequential steps of a first embodiment of the method of manufacturing a semiconductor laser device, i.e., a GaInAsP-/InP semiconductor laser device, according to the invention. First, on n-type InP substrate 10 are sequentially crystal-grown by a liquid-phase epitaxial process 1-$\mu$thick n-type InP buffer layer 11 having a donor concentration of $3 \times 10^{18}$ cm$^{-3}$ and 0.2-$\mu$m thick active layer 12. Active layer 12 consists of approximately 0.1-$\mu$m thick first layer 12e, which consists of InGaAsP corresponding to a wavelength of 1.55 $\mu$m and contributes to light emission, and approximately 0.1-$\mu$m second layer 12f, which is formed on the first layer, consists of InGaAsP corresponding to a wavelength of 1.3 $\mu$m and contributes to light guiding. Active layer 12 has a composition Ga$_x$In$_{(1-x)}$As$_y$P$_{(1-y)}$ ($0 < y \leq 1$). From the conditions of lattice matching with respect to InP substrate 10, the value of x is given as x=0.1894y/(0.4184−0013y). First layer 12e consists of InGaAsP with y of approximately 0.9, and second layer 12f consists of InGaAsP with y of approximately 0.6. As shown in FIG. 2A, SiO$_2$ layer 30 is formed by the CVD process on the entire surface of active layer 12. Resist layer 31 is then coated on SiO$_2$ layer 30 and patterned to expose a portion of SiO$_2$ layer 30, more specifically, form a pair of transversely spaced-apart stripe-like openings in a central portion of the resist layer and remove transversely opposite end portions thereof. Then, as shown in FIG. 2B, with the patterned resist layer 31 as mask, the exposed portions of SiO$_2$ layer 30 and corresponding portions of lower active layer 12 are selectively etched away. Consequently, active layer 12 is separated into central region 12a and side active regions 12b spaced apart transversely by the stripe-like grooves from the opposite sides of central region 12a. Central region 12a has a stripe-like shape having width of approximately 1.5 $\mu$m. Subsequently, remaining resist layer 31 and SiO$_2$ layer 30 are removed. Then, as shown in FIG. 2C, over the entire surface, i.e., the exposed top surfaces of active layer 12 and InP buffer layer 11, are sequentially formed by the liquid-phase epitaxial growth process 1-$\mu$m thick p-type InP clad layer or low resistance layer 13 having an acceptor concentration of $1\times10^{18}$ cm$^{-3}$ and 0.4μm thick p-type InGaAsP cap layer 14 having an acceptor concentration of $3\times10^{18}$ cm$^{-3}$. At this time portions of clad layer 13 fill as buried portions 13a the grooves defined by central and side active regions 12a and 12b. Then, SiO$_2$ layer 32 is formed by the CVD process over the entire surface of cap layer 14, and a rectangular window is formed in a transversely central portion of layer 32 to expose a corresponding central portion of cap layer 14. The dimensions of the window are set such that central active region 12a is located in a central portion of the window and portions of side active regions 12b occupy end portions of the window. In this embodiment, the width of the window is set to approximately 9.5 μm. Then, ohmic electrode 15 consisting of Au/AuZn-/Au/Cr/Au is formed on exposed portion of cap layer 15 by the lift-off process with SiO$_2$ layer as mask. Then, as shown in FIG. 2D, p-side first layer 16a, which is subsequently used as mask, is deposited to a thickness of approximately 2 μm by electric field plating with ohmic electrode 15 as base. Then with this first layer 16a as mask entire SiO$_2$ layer 32 and portion of cap layer 14 under layer 32 are selectively etched away to expose transversely opposite end portions of clad layer 13. Protones are then implanted into exposed portion of clad layer 13 with first layer 16a as mask. The implantation of protons is done with the implantation energy set to approximately 150 keV and the dose set to $5\times10^{14}$ cm$^{-2}$. It will be understood that no proton is implanted into a portion right under first layer 16a for this layer serves as mask. The system is then annealed at a temperature of approximately 450° C. to sinter electrode 15 and render the region of clad layer 13, into which protons have been implanted, to be a high resistivity region 35 having a resistivity of, for instance, $10^5$ Ωcm or above. Consequently, as shown in FIG. 2E, clad layer 13 is divided into central, low resistivity region 13c having a width of approximately 9.5 μm and opposite side, high resistivity regions 13d. The low resistivity region is in the form of mesa and hence constitutes a mesa region. The resistivity of active layer 12 and the central portion of InP buffer layer 11 will never be increased by the heat treatment as described above. Subsequently, SiO$_2$ film 18 is formed over the entire surface, and its portion covering first layer 16a is selectively etched away. Then, over the entire surface, i.e., the surfaces of first layer 16a and remaining SiO$_2$ layer 18, p-side electrode or second layer 16b is formed as shown in FIG. 2F by depositing Ti/Pt/Au and then forming a Au layer. P-side electrode 16 is constituted by first layer 16a located over ohmic contact electrode 15 and second layer 16b partly in ohmic contact with first layer 16a. Subsequently, resist layer 33 is formed on second layer 16b and then patterned to form windows as will be described later in detail. With patterned resist layer 33 second layer 16b and lower SiO$_2$ film 18 are selectively etched away to form windows, via which high resistivity region 13d of clad layer 13 is selectively removed with hydrochloric acid to form windows 34. Since hydrochloric acid does not have any etching effect on InGaAsP although it has etching effect on InP, the etching at this time is stopped at the top surface of side active regions 12b to partly expose this surface. Windows 34 extend in the vertical direction as shown in FIG. 2G, so they are hereinafter referred to as vertical holes. Subsequently, side active regions 12b are entirely etched away in a sufficiently long time by using an etchant composed of sulfric acid, hydrogen peroxide and water (in proportions of 4:1:1), thus forming windows 35. At this time, the sidewise etching toward central active region 12a is stopped by buried portions 13a, so that central active region 12a is never etched. Windows 35 extends horizontally as shown in FIG. 2H, so they are called horizontal holes. It will be understood that vertical holes 34 and associated horizontal holes 35 are communicated with one another for side active regions 12b are removed via the vertical holes. In this embodiment, vertical holes 34 have a rectangular shape with dimensions of 5 μm×5 μm, and they are formed in a pattern consisting of two rows each consisting of 10 holes arranged at a pitch of 20 μm, these two rows extending symmetrically in the direction of extension of and on the opposite sides of central active region 12a. Subsequently, as shown in FIG. 2I, resist layer 33 is removed to expose the top surface of second layer 16b of the p-side electrode, and gold lead 100 is bonded to the surface of a portion of exposed second layer 16b over high resistivity region 13d. That is, of second layer 16b a portion above high resistivity region 13d is utilized as bonding pad. Finally, n-side electrode 17 consisting of n-type Au/Ge is formed on InP substrate 10. FIGS. 2J and 2K show the semiconductor laser device completed in this way in sections taken along different lines from that of FIG. 2I. FIG. 2J is a sectional view taken along line 2J—2J in FIGS. 2I and 2K, and FIGS. 2I and 2K are sectional views taken along lines 2I—2I and 2K—2K in FIG. 2J. It seems from FIG. 2I that high resistivity region 13d of clad layer 13 is perfectly separated into portions near and remote from low resistivity region 13c by vertical holes 34. However, it will be readily understood that these portions are continuous to each other (see FIG. 2K) and that the portion of high resistivity region 13d of clad layer 13 remote from low resistivity region 13c is contiguous to InP buffer layer 11 over a considerably wide range.

In the semiconductor laser device having the above construction, of low resistivity region 13c of clad layer 13 an upper portion having a greater width has the opposite sides surrounded or sandwiched by high resistivity regions 13d, and a lower portion having a small width is surrounded or sandwiched by horizontal holes 35. Thus, clad layer 13 has the same shape as the clad layer of a prior art constricted mesa type semiconductor laser device. Thus, like the prior art device, the homo p-n junctions on the opposite sides of central active region 12a, i.e., p-n junction between each low resistivity buried portion 13a of p-type clad layer 13 and n-type InP buffer layer 11, have a narrow junction area so that they can be low leakage, low capacitance p-n junctions. Further, the stripe width of p-side electrode contact portion, i.e., ohmic electrode 15 and first layer 16a, may be made sufficiently large compared to the stripe width of the active region, i.e., central active region 12a, so that it is possible to reduce the series resistance as well. Further, the parasitic capacitance of the pad portion can be reduced because there is a considerably thick high resistivity layer, i.e., high resistivity region 13d, between p-side electrode second layer 16b as bonding region and InP buffer layer 11. Thus, it is possible to obtain high speed response comparable to or higher than in the case of low leakage, constricted mesa type. This device basically has a planar mechanical structure. Low resistivity region 13c of clad layer 13 is not mechanically supported only by central active region 12a and buried portions 13a, but it is also supported from the periphery by integral high resistivity regions 13d secured to InP buffer layer 11. Therefore, a very stable structure can be obtained. Furthermore, SiO$_2$ film 18 which constitutes a cause of generation of internal stress is stepless, so that there is no need of increasing its thickness to make up for any step, and also high resistivity regions 13d permit capacitance reduction. Therefore, SiO$_2$ film 18 may be made thin. This permits great improvements in the mechanical strength, yield, reliability and cost.

A second embodiment will now be described with reference to FIGS. 3A to 3C.

FIG. 3C is a sectional view taken along line 3C—3C in FIGS. 3A and 3B, and FIGS. 3A and 3B are sectional views taken along lines 3A—3A and 3B—3B in FIG. 3C.

In the semiconductor laser device of this embodiment, the techniques described before in connection with the first embodiment are adopted for one side (i.e., left side in the Figures). For the opposite side (i.e., right side in the Figures), high resistivity region 13d of clad layer 13 on InP buffer layer 11 is removed, and n-type ohmic electrode 17 is formed on the exposed surface of InP buffer layer 11. A metal forming second layer 16b is deposited on ohmic electrode 17, but it does not affect the characteristics of the device at all. The selective removal of clad layer 13 may be done before the proton implantation, i.e., before rendering regions 13d to be high resistivity regions. Although low resistivity region 13c of clad layer 13 is integrally supported only on one side by high resistivity region 13d, the stress on central active region 12a is alleviated, and also disconnection of n-side electrode second layer 16b of the n-side electrode can be eliminated.

In this embodiment, vertical and horizontal holes 34 and 35 are filled with material 41 having a coefficient of thermal expansion comparatively close to that of InP, e.g., a light-sensitive polyimide resin for more satisfactory prevention of stress concentration in central active region 12a. It will be readily assumed that such filling with such material can be effected in the case of the preceding first embodiment. This embodiment is different from the preceding embodiment in that the implantation of protones is effected through cap layer 14 which has not been removed. The rendering of region 13d to high resistivity region with such proton implantation technique can be satisfactorily done by increasing the proton implantation energy.

The impurity that is implanted for rendering portions of clad layer 13 to be high resistivity regions in the first and second embodiments, is not limited to protons, but it is possible to use heavy hydrogen, tritium, helium, beryllium and boron either alone or in combination.

A third embodiment will now be described with reference to FIGS. 4A and 4D.

As shown in FIG. 4A, on semi-insulating InP substrate 10 are sequentially formed n-type InP buffer layer 11, GaInAsP active layer 12, p-type InP first layer 13A and photoresist layer 31. InP buffer layer 11 is 0.25 $\mu$m thick and has a carrier concentration of $1 \times 10^{17}$ cm$^{-3}$. Active layer 12 is undoped and 0.12 $\mu$m thick, and its composition is selected such as to emit light having a wavelength of 1.55 $\mu$m. First layer 13A is 0.2 $\mu$m thick and has a carrier concentration of $1 \times 10^{17}$ cm$^{-3}$. Photoresist layer 31 which serves as mask consists of a quinonediazide resist and is 0.5 $\mu$m thick. It is patterned to form a pair of parallel stripe-like windows spaced apart by 1 $\mu$m and each having a width of 1.5 $\mu$m and a further stripe-like window extending parallel to the pair windows and having a width of 1.5 $\mu$m. Instead of using this mask, it is possible to form an SiO$_2$ layer on first layer 13A and effect a tentative pattern transfer via a photoresist layer.

Using the mask as noted above, first layer 13A and active layer 12 are selectively etched to separate active layer 12 into central active region 12a and side active region 12b. This etching is conducted using a hydrochloric acid etchant for first layer 13A and a sulfric acid etchant for active layer 12 until the top surface of InP buffer layer 11 is exposed. Then, as shown in FIG. 4B, after removing of photoresist layer 31, p-type InP second layer 13B and p-type GaInAsP cap layer 14 are sequentially crystal-grown. First and second layers 13A and 13B constitute clad layer 13. Second layer 13B which is crystal-grown, has a pair of first buried portions 13a and a second stripe-like buried portion 13f buried in windows or grooves between adjacent active regions located on the exposed surface of InP buffer layer 11. Second layer 13B is 1 $\mu$m thick and has a carrier concentration of $2 \times 10^{18}$ cm$^{-3}$. Cap layer 14 is 0.5 $\mu$m thick and has a carrier concentration of $1 \times 10^{19}$ cm$^{-3}$. Cap layer 14 has a composition selected such as to emit light having a wavelength of 1.3 $\mu$m.

Figure 4C:
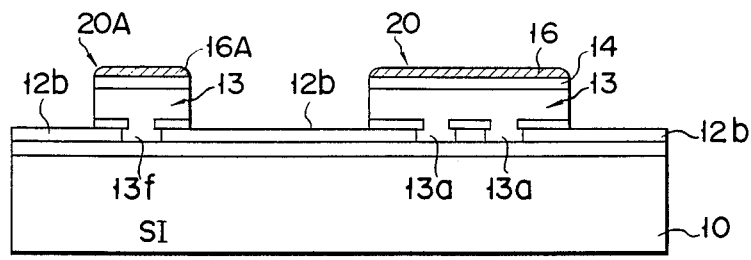

Subsequently, a mask consisting of a photoresist is formed on cap layer 14, and cap layer 14, clad layer 13 and active layer 12 are selectively etched away to form two mesa portions 20 and 20A as shown in FIG. 4C.

The etching at this time is mesa etching to remove portions of the layers noted above other than portions including buried portions 13a and 13f and surrounding clad and cap layers 13 and 14 to expose side active regions 12b. In FIG. 4D, reference numerals 16 and 16A designate p-side electrodes formed on the portions of cap layer 14 constituting mesa portions 20 and 20A after the mesa etching. These electrodes are formed by forming and patterning an AuZn layer such that eventual electrodes 16 and 16A have respective widths of 10 and 3 $\mu$m, followed by a heat treatment at 420° C.

Subsequently, side active regions 12b are entirely removed using sulfuric acid etchant. At this time, constricted portions are formed in mesa portions 20 and 20A in portions thereof contiguous to InP buffer layer 11 for side active regions 12b extends into the mesa portions. In mesa portion 20, the constricted portion is formed by central active region 12a and opposite side buried portions 13a. In other mesa portion 20A, the constricted portion is formed by sole buried portions 13f.

Figure 4D:
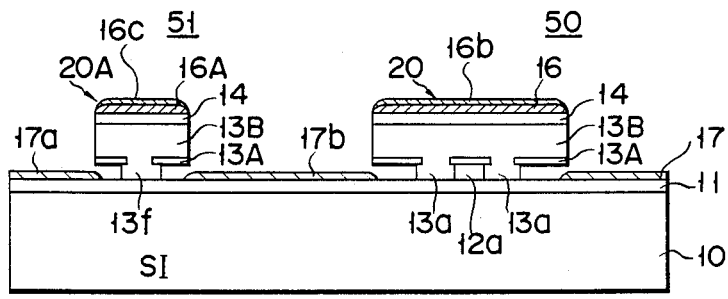

Subsequently, as shown in FIG. 4D, AuGe is deposited on InP buffer layer 11 followed by a heat treatment at 350° C., thus forming three electrodes 17, 17a and 17b independent of one another. The deposition is conducted without formation of any mask for self-alignment is obtained with the p-side electrode providing a function as mask. First electrode 17 serves as n-side electrode of semiconductor laser element 50, and second and third electrodes 17a, 17b on the opposite sides of mesa portion 20A serve as respective source and drain electrodes of p-n junction field-effect transistor element 51. Although AuGe making electrodes 17b, 17c is also deposited on electrodes 16, 16A, they do not affect the device.

In this embodiment, accurate patterns can be formed, and a semiconductor laser device and other element or MOS field-effect transistor can be formed in an integrated fashion in a comparatively simple process.

Figure 5:
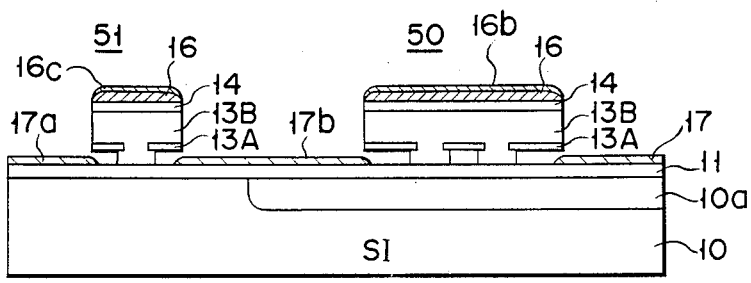
FIGS. 5 and 6 are sectional views showing fourth and fifth embodiments, respectively.

A fourth embodiment will now be described with reference to FIG. 5.

In this embodiment, n-type lead region 10a is formed in a surface portion of InP substrate 10. Lead region 10a extends from a position corresponding to the underside of third electrode or drain electrode 17b to a position corresponding to the underside of central active region 12a. With this structure, the lead resistance between the field-effect transistor and semiconductor laser device can be reduced, which is effective for high-speed response of the element.

Lead region 10a may be formed by selectively introducing an impurity into InP substrate 10 prior to the crystal growth of InP buffer layer 11. The introduction of the impurity may be done by utilizing a diffusion process or an ion implantation process. Alternatively, comparatively shallow mesa etching may be done on the top surface of InP substrate 10, and a lead region may be crystal-grown on the etched portion. In this embodiment, lead region 10a is 1 μm thick and has a carrier concentration of $5 \times 10^{18}$ cm$^{-3}$.

Figure 6:
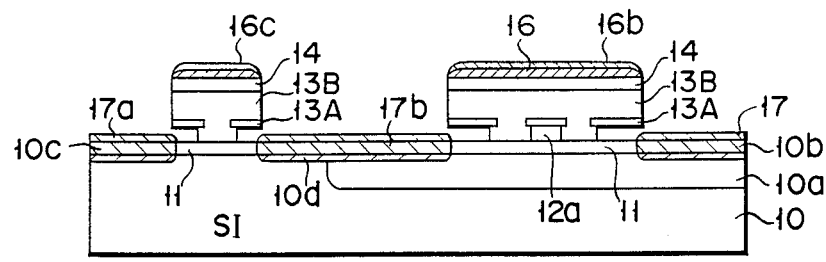

A fifth embodiment will now be described with reference to FIG. 6. In this embodiment, high carrier concentration layers 10b, 10c and 10d are formed in portions of buffer layer 11 under first electrode 17, and source and drain electrodes 17a and 17b and source and drain regions of InP substrate 10. High carrier concentration layers 10b, 10c, 10d may be formed by the ion implantation process after formation of clad layer 13. This structure permits reduction of the source and drain resistances.

A sixth embodiment will now be described with reference to FIGS. 7A to 7D.

Figure 7A:
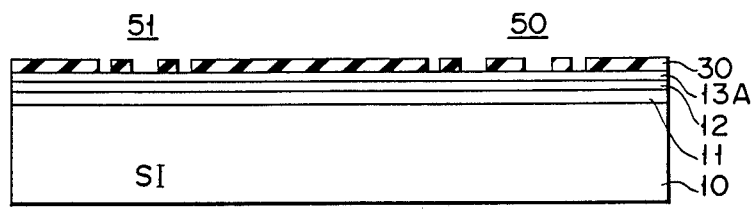
FIGS. 7A to 7D are sectional views showing sequential steps of a sixth embodiment of the method of manufacturing a semiconductor laser device according to the invention.
Figure 7B:
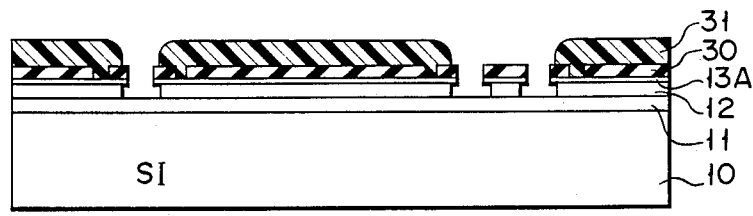
Figure 7C:
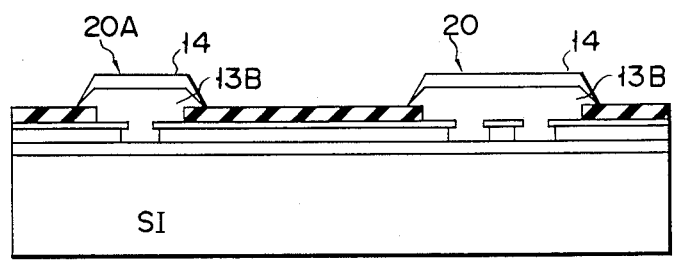
Figure 7D:
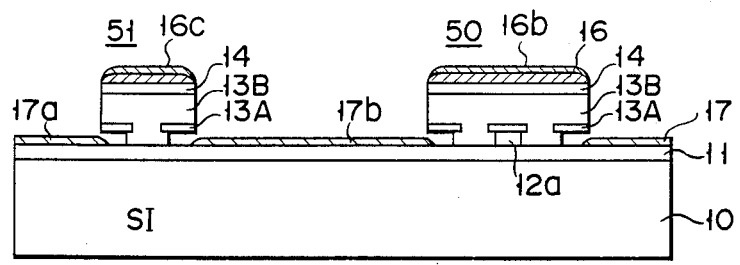

As shown in FIG. 7A, on semi-insulating InP substrate 10 are sequentially formed n-type InP buffer layer 11, GaInAsP active layer 12, p-type InP first layer 13A and SiO$_2$ layer 30. SiO$_2$ layer 30 which serves as mask is formed, on the side of semiconductor laser element 50, with a pair of parallel stripe-like main windows spaced apart by 1 μm and each having a width of 1.5 μm and a pair of narrow stripe-like auxiliary windows slightly spaced apart from and extending parallel to the main windows and defining the width of element. SiO$_2$ layer 30 is also formed, on the side of field-effect transistor element 51, with a stripe-like main window having a width of 1.5 μm and a pair of narrow stripe-like auxiliary windows slightly spaced apart and extending parallel to the main windows and defining the width of the source-drain spacing. Subsequently, the upper surface of SiO$_2$ layer 30 and upper surface of first layer 13A of clad layer exposed by the auxiliary windows are covered by photoresist layer 31, which is then selectively etched to remove its portions corresponding to portions of first layer 13A exposed by the main windows and corresponding portions of lower active layer 12, as shown in FIG. 7B. Then, photoresist layer 31 is removed, and then second layer 13B of clad layer and cap layer 14 are selectively crystal-grown to form first and second mesa portions 20 and 20A as shown in FIG. 7C. By using such selective growth it is possible to reliably recognize the ground pattern position. This has an effect of improving the accuracy of pattern alignment between the ground pattern and the pattern of layer formed on the ground pattern. Afterwards, a process consisting of the steps in the third embodiment and a step of removing SiO$_2$ layer is performed to obtain a semiconductor laser device having semiconductor laser element 50 and field-effect transistor 51 as shown in FIG. 7D.

A seventh embodiment will now be described with reference to FIGS. 8A and 8F.

Figure 8A:
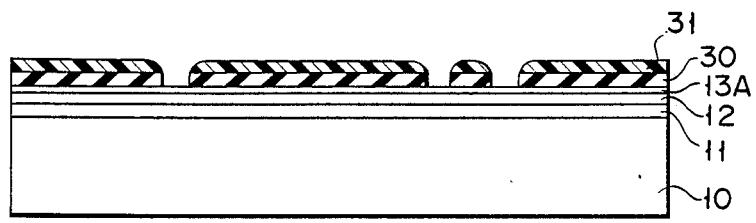
FIGS. 8A to 8G are sectional views showing sequential steps of a seventh embodiment of the method of manufacturing the semiconductor laser device according to the invention.
Figure 8B:
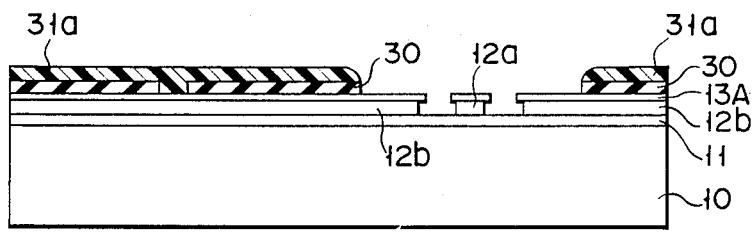
Figure 8C:
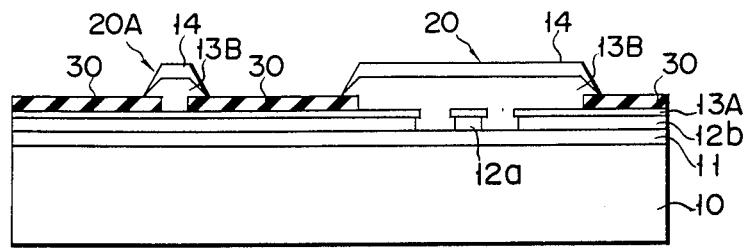
Figure 8D:
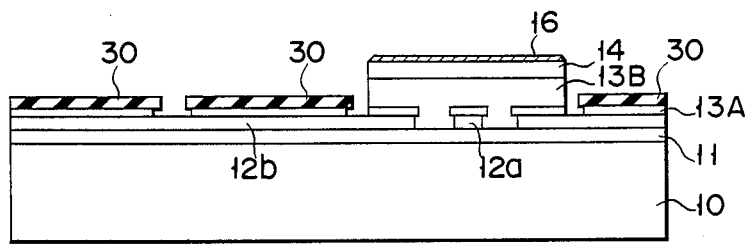
Figure 8E:
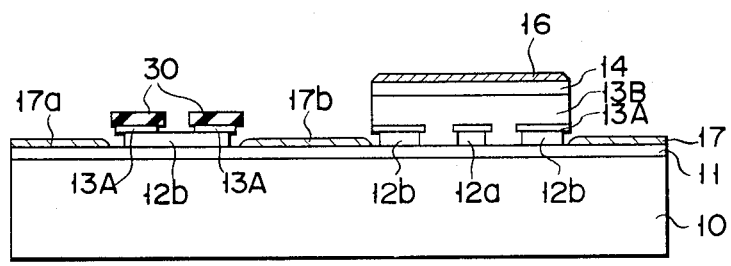
Figure 8F:
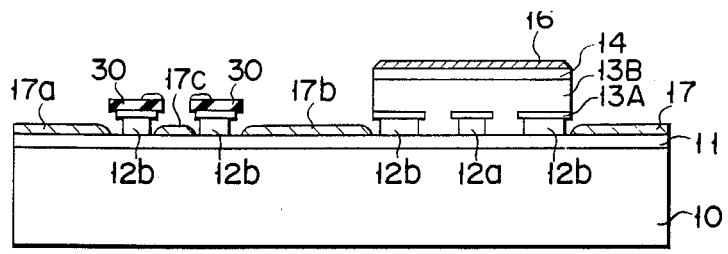
Figure 8G:
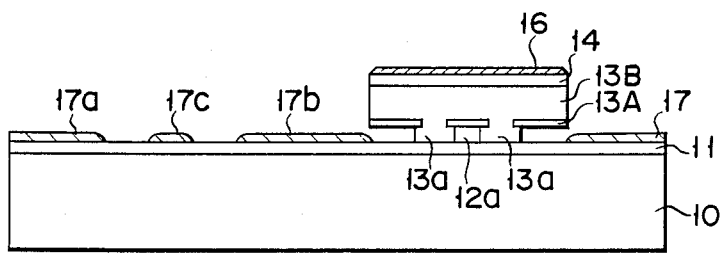

As shown in FIG. 8A, on semi-insulating InP substrate 10 are sequentially formed n-type InP buffer layer 11, GaInAsP active layer 12, p-type InP first layer 13A, SiO$_2$ layer 30 and photoresist layer 31. Photoresist layer 31 serving as mask is patterned to form a pair of parallel stripe-like windows spaced apart by 1 μm and each having a width of 1.5 μm and a stripe-like window spaced apart from and extending parallel to the pair windows and having a width of 1.0 μm. With this mask, the exposed stripe-like portions of SiO$_2$ layer 30 are etched away. The other layers than SiO$_2$ layer 30 may be formed with the same conditions and processes as in the third embodiment. SiO$_2$ layer 30 is formed by the CVD process at 300° C. so that it has a thickness of 1,500 angstroms. Subsequently, with the mask as noted above first layer 13A and active layer 12 are selectively etched to separate active layer 12 into central active region 12a and side active regions 12b. The etching at this time is conducted by using a hydrochloric acid etchant for first layer 13A and using a sulfric acid etchant for active layer 12 until the top surface of InP buffer layer 11. Subsequently, photoresist layer 31 is removed, and new photoresist layer 31a is formed on SiO$_2$ layer 30 and exposed surface of first layer 31A and patterned to remove its portions corresponding to the pair windows of SiO$_2$ layer 31. With photoresist layer 31a as mask, tee exposed portion of SiO$_2$ layer 30 is removed, as shown in FIG. 8B. Subsequently, as in the sixth embodiment, first and second mesa portions 20 and 20A having second layer 13B and cap layer 14 as shown in FIG. 8C are formed by the crystal growth process and mesa etching. Subsequently, entire mesa portion 20A and side portions of first mesa portion 20 are etched away, and p-side electrode 16 is formed on the top as shown in FIG. 8D. At this time, second mesa portion 20A and a portion of first layer 13A of clad layer under second mesa portion 20A are removed. Subsequently, SiO$_2$ layer 30 is selectively etched to leave stripe-like portions having a predetermined width along opposite sides of first layer 13A. Then, first layer 13A is selectively etched to leave portions under the pair stripe-like portions of SiO$_2$ layer 30 and those in first mesa portion 20. Further, side active regions 12b are selectively etched to leave portions under the pair stripe-like portions of SiO$_2$ layer 30 and a portion between these portions to expose portions of the top surface of InP buffer layer 11 on the opposite sides of and also on the opposite sides of first mesa portion 20. First, second and third electrodes 17, 17a and 17b are then formed on the exposed surface, as shown in FIG. 8E. Then, a portion of side active region 12b between the pair stripe-like portions of SiO$_2$ layer 30 is selectively removed, and gate electrode 17c is formed on the exposed surface of InP buffer layer 11 as shown in FIG. 8F. Finally, the remaining portions of side active region 12b are removed using a sulfric acid etchant. At this time, like the above embodiment central active region 12a contained in the first mesa portion is not removed for it is protected by buried portions 13a of clad layer 13, and only side active regions 12b on the outer side of the buried portions are removed as shown in FIG. 8G.

Figure 9:
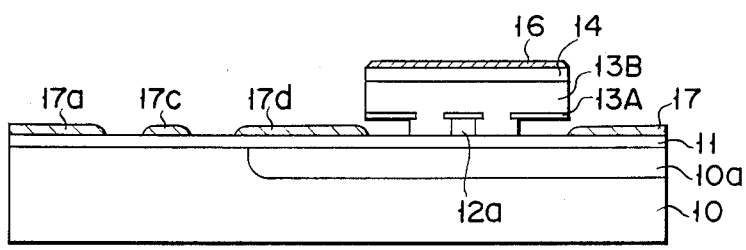
FIG. 9 is a sectional view showing an eighth embodiment of the semiconductor laser device according to the invention.

An eighth embodiment is shown in FIG. 9. This embodiment is the same as the preceding seventh embodiment except for that lead region 10a described before in connection with the fourth embodiment is formed in InP substrate 10.

Figure 10A:
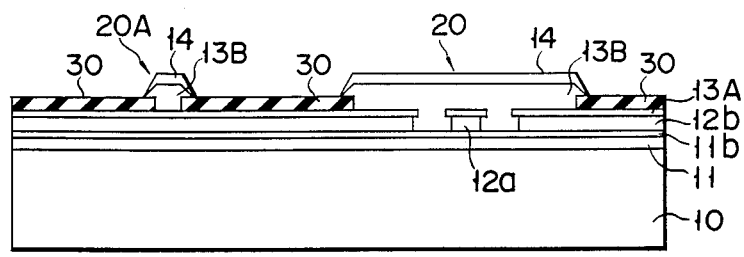
FIGS. 10A to 10C are sectional views showing sequential steps of a ninth embodiment of the method of manufacturing a semiconductor laser device according to the invention.
Figure 10B:
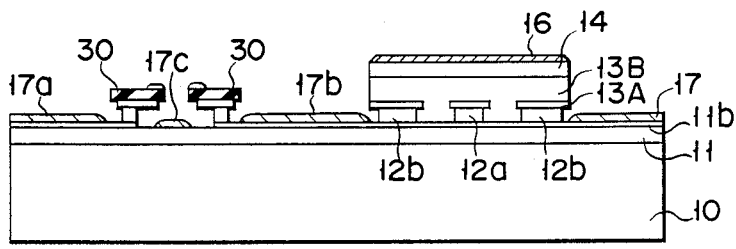
Figure 10C:
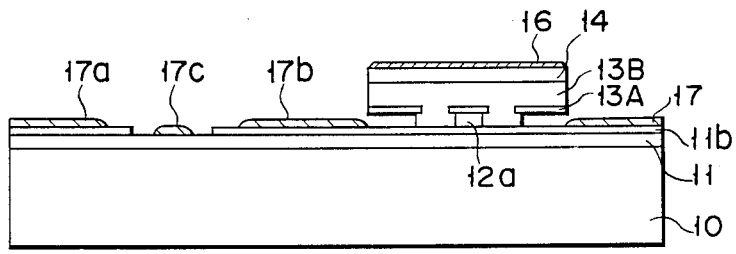

A ninth embodiment will now be described with reference to FIGS. 10A to 10C. This embodiment is similar to the previous seventh embodiment shown in FIGS. 8A to 8G, so it will be described in comparison to the seventh embodiment. The step shown in FIG. 10A corresponds to the step shown in FIG. 8C, the step shown in FIG. 10B corresponds to the step shown in FIG. 8F, and the step shown in FIG. 10C corresponds to the step shown in FIG. 8G. As will be understood from the Figures showing these steps, in this embodiment second InP buffer layer 11b, which is a 0.15-μm thick n-type InP layer having a carrier concentration of $5 \times 10^{17}$ cm$^{-3}$ is formed between first InP buffer layer 11 and active layer (i.e., central and side active regions 12a and 12b). In other words, laminated first and second layers 11 and 11b constitute an active or buffer layer having a thickness of 0.4 μm. In this embodiment, an upper portion of the MESFET active layer is rendered to be a high carrier concentration portion to reduce the resistance of the active layer.

A tenth embodiment will now be described with reference to FIGS. 11A and 11G.

Figure 11E:
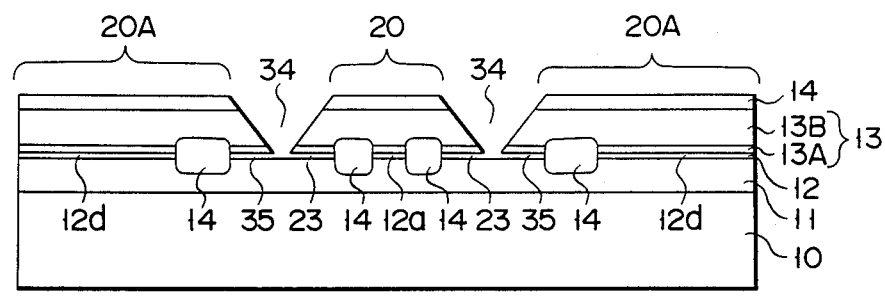

As shown in FIG. 11A, on semi-insulating InP substrate 10 are sequentially formed n-type InP buffer layer 11, GaInAsP active layer 12, p-type InP first layer 13A and photoresist layer 31. Photoresist layer 31 is patterned to form a pair of parallel stripe-like main windows spaced apart by 1 μm and a pair of stripe-like auxiliary windows spaced apart by 20 μm from the opposite sides of and extending parallel to the main windows and having a width of 5 μm. Then, as shown in FIG. 11B, with the mask noted above first layer 13A and active layer 12 are selectively etched to form main and auxiliary grooves under the main and auxiliary windows. The main grooves separate active layer 12 into central active region 12a and side active regions 12b. The auxiliary grooves each separate each side active region 12b into portion 12c corresponding to a spacer region and portion 12d corresponding to a field region. The etching at this time is conducted using a hydrochloric acid etchant for first layer 13A and a sulfric acid etchant for active layer 12 until the top surface of InP buffer layer 11. At this time, portion 12d corresponding to the field region and corresponding portion of upper first layer 13A may be removed. Further, exposed surface portions of InP buffer layer 11 may be removed. Subsequently, as shown in FIG. 11C, high resistivity InP buried portions 13a and 13b are selectively crystal-grown in the main and auxiliary grooves such that their top portions slightly project from first layer 13A. Then, as shown in FIG. 11D, p-type InP second layer 13B and p-type GaInAsP cap layer 14 are sequentially crystal-grown on first layer 13A and buried portions 13a and 13b. First and second layers 13A and 13B and buried layers 13a and 13b constitute clad layer 13.

Figure 11F:
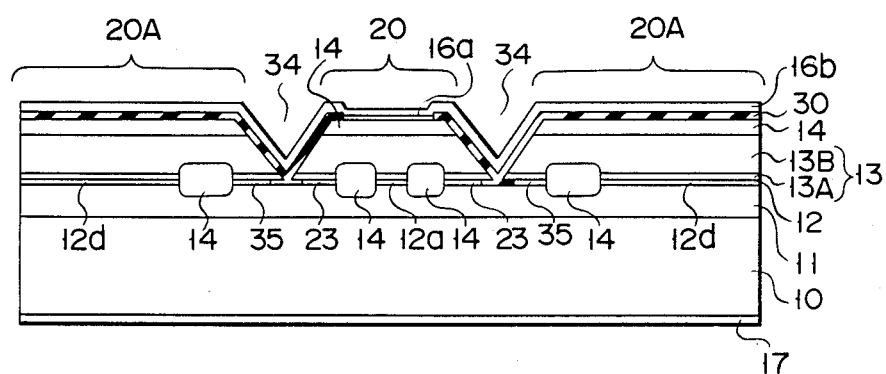

Subsequently, a process for reducing capacitance is performed. More specifically, cap layer 14 and clad layer 13 in the spacer region are selectively removed to form grooves or vertical holes 34, form main mesa portion 20 and a pair of auxiliary mesa portions 20A on the opposite sides of main mesa portion and expose the top surface of portions 12c of side active regions corresponding to the spacer region. The etching at this time, as in the preceding embodiment, is conducted by selectively using a sulfuric acid etchant and a hydrochloric acid etchant, so that it can be stopped accurately at the top surface of the active layer. Subsequently, active layer portions 12c in the spacer region are selectively removed, thus forming gaps or horizontal holes 35 between the bottom surface of side portions of mesa portions 20 and 20A and InP buffer layer 11. The lateral etching of active layer portions 12c at this time is stopped by buried portions 13a of main mesa portion 20 and buried portions 13b of auxiliary mesa portion 20A. Subsequently, SiO$_2$ layer 30 is deposed on the mesa portion surfaces, and its portion corresponding to cap layer 14 of main mesa portion 20 is selectively removed. On the exposed surface, ohmic electrode or first electrode 16a is formed. Then, second electrode layer 16b is formed on SiO$_2$ layer 30 inclusive of electrode layer 16a, and n-side electrode 17 is formed on InP substrate 10, thus completing a semiconductor laser device as shown in FIGS. 11F and 11G.

An eleventh embodiment is shown in FIG. 12. In the previous ninth embodiment buried portions 13a of main mesa portion 20 and buried portions 13b of auxiliary mesa portion 20A are completely separated from one another by horizontal holes 35. In this embodiment, both buried portions 13a and 13b are connected together by forming InP connector portions 13a-1. Connector portions 13a-1 are formed between and integral with buried portions 13a and 13b such that they are spaced apart by a predetermined distance. Horizontal holes 35 are formed between connector portions 13a-1.

A twelfth embodiment is shown in FIG. 13. In this embodiment, the technical concept underlying the prevent invention is applied to a semiconductor laser device of surface light emission type. In this instance, three-dimensional central active region 12a is used in lieu of stripe-like central active region 12a. In this example, buried portion 13a of the main mesa portion is formed such as to surround the four sides of central active region 12a, horizontal hole 35 is formed such as to surround buried portion 13a, and buried portion 13b of the auxiliary mesa portion is formed such as to surround horizontal hole 35.

A thirteenth embodiment is shown in FIG. 14. While in the previous ninth embodiment the buried portion consists of the sole high resistivity InP, in this embodiment it consists of a p-n reverse bias portion formed by p-type InP first layer 13p and n-type InP second layer 13n.

A fourteenth embodiment is shown in FIG. 15. In this instance, buried portions 13a and 13b are formed integrally with, i.e., simultaneously with the crystal growth of, second layer 13B of clad layer 13.

A fifteenth embodiment is shown in FIG. 16. In this instance, p- and n-type layers 13p and 13n are formed on the first layer side of second layer 13B of clad layer 13. Thus, in this embodiment, like the case of FIG. 14, a p-n reverse bias layer is formed in buried portions 13a and 13b. On the upper surface of central active region 12a, there is no p-type layer, but there is only n-type layer 13n.

Sixteenth to eighteenth embodiments are shown in respective FIGS. 17 to 19. In these embodiments, the active layer is separated into central and side active regions 12a and 12b without formation of any groove but by preliminarily forming InP substrate 10 with a step and forming thereon InP buffer layer 11 and active layer 12.

In the embodiment shown in FIG. 17, a pair of parallel stripe-like recesses 10b are formed at a predetermined distance from each other in the upper surface of n-type InP substrate 10. The distance between the recesses 10b defines the width of central active region 12a, and in this embodiment it is set to approximately 1 μm. Then, relatively thin p-type InP buffer layer 11 and GaInAsP active layer 12 are sequentially crystal-grown on the surface of InP substrate 10. Thus, InP buffer layer 11 and active layer 12 are separated by the opposite side steps of the recesses into portions in recesses 10b and other portions. More specifically, active layer 12 is automatically separated into central active region 12a between the recesses, portions in recesses 10b, i.e., portions in the spacer region and to be subsequently removed, and portions 12d on the outer sides of the recesses, i.e., portions in the field region. Subsequently, the same steps as in the ninth embodiment are performed to form various elements so as to complete a semiconductor laser device.

In the embodiment of FIG. 18, a pair of parallel stripe-like raised portions 10a are formed at a predermined distance from each other on the upper surface of n-type InP substrate 10. The distance between raised portions 10a is set to approximately 1 μm. Subsequently, relatively thin p-type InP buffer layer 11 and GaInAsP active layer 12 are sequentially crystal-grown on the surface of InP substrate 10. Thus, InP buffer layer 11 and active layer 12 are separated by the steps at the opposite sides of the raised portions into portions on raised portions 10a and other portions. More specifically, active layer 12 is automatically separated into central active region 12a between the raised portions, portions on raised portions 10a, i.e., in the spacer region, to be removed later and portions 12d on the outer side of raised portions 10a, i.e., in the field region.

The seventeenth embodiment of FIG. 19 is the same as in the previous sixteenth embodiment except for that an impurity is preliminarily doped into raised portions 10a to form p- and n-type layers 13p and 13n, thus forming a p-n reverse bias layer.

Now, an example of taking out electrodes in the above device will be described with reference to FIGS. 20A to 20F. In this example, an electrode section or bonding pad is formed concurrently with the process of manufacture of the semiconductor laser device, and elements substantially like those in the embodiment are designated by like reference numerals, and their duplicated description is omitted.

Figure 20C:
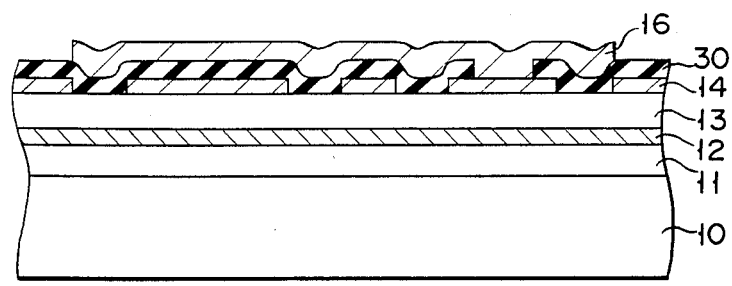
Figure 20E:
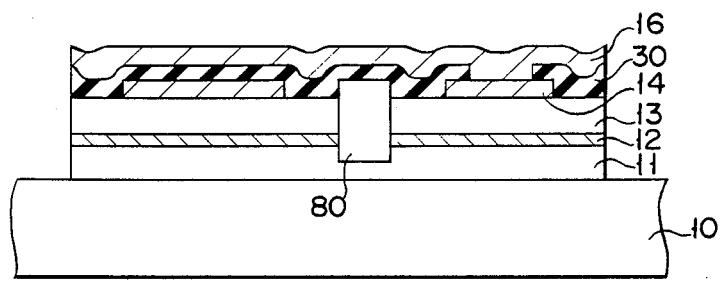
Figure 20F:
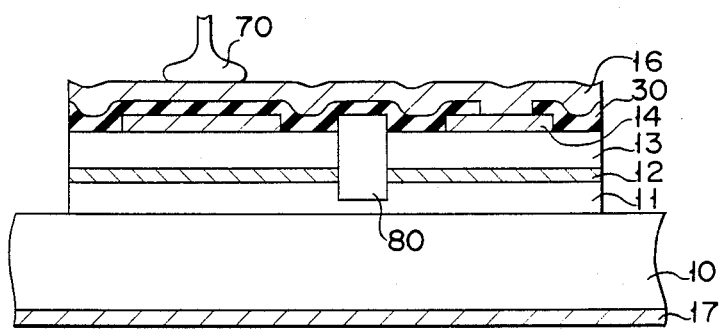

On n-type InP substrate 10 are sequentially crystal-grown n-type InP buffer layer 11, GaInAsP active layer 12, n-type InP first layer 13 and p-type GaInAsP cap layer 14. Cap layer 14 is then selectively to form grooves 14a and 14b so as to expose corresponding portions of clad layer 13 as shown in FIG. 20A. These grooves, as shown in FIG. 20B, consists of a a pair of parallel stripe-like grooves 14a spaced apart by a predetermined distance and a rectangular frame-like second groove 14b spaced apart from the first grooves and surrounding a bonding region. Subsequently, SiO₂ layer 30 is formed on cap layer 14 and clad layer 13 exposed in the grooves and selectively etched to expose portions of cap layer 14 in first grooves 14a. Au-Zn n-side electrode 16 is then formed on the exposed portions of cap layer 14 and SiO₂ layer 30 as shown in FIG. 20C. Electrode 16, as shown in FIG. 20D, consists of stripe-like portion 16A in and between first grooves 14a, bonding pad portion 16B in second groove 14b and an area surrounded thereby and neck-like bridging portion 16C connecting together stripe portion 16A and pad portion 16B. Subsequently, a portion of SiO₂ layer 30 corresponding to a portion other than portion right under electrode 16, i.e., portion other than bridging portion 16C and on the opposite sides of stripe portion 16A and surrounding pad portion 16B to expose cap portion 14. Then cap layer 14 is selectively etched with SiO₂ layer 30 as mask. At this time, a portion of cap layer 14 right under bridging portion 16C is removed by a side etching effect by using a sulfuric acid etchant as in the above embodiment. At this time, portions of SiO₂ layer 30 in grooves 14a and 14b serve as lateral etching stopper with respect to portions of cap layer 14 right under stripe portion 16A and pad portion 16B. In the thickness direction, the etching is stopped by the top surface of clad layer 13. Although the etching of the portion of cap layer 14 right under bridging portion 16C requires a long etching process, it has no adverse effects on other portions for SiO₂ layer 30 and clad layer 13 automatically serve the role of etching stopper. Subsequently, via the cavity formed as a result of removal of the portion of cap layer 14 right under bridging portion 16C and portions near electrode 16, surface portions of clad layer 13, active layer 12 and InP buffer layer 11 right under the cavity are etched away to form cavity 80 as shown in FIG. 20E. If the etching at this time is done such as to penetrate active layer 12, it is not necessary to etch away the surface portion of InP buffer layer 11. Subsequently, gold lead wire 70 is bonded to pad portion 16B of electrode 16 as shown in FIG. 20F. In this way, an electrode section of semiconductor laser device is formed.

What is claimed is:

1. A semiconductor laser device comprising:
   a substrate having a first semiconductor layer of a first conductivity type; and
   a semiconductor laser element and an auxiliary mechanism, provided side by side on said substrate;
   said semiconductor laser element including:
   a mesa portion having a second semiconductor layer provided above said first semiconductor layer and of a second conductivity type;
   an active region consisting of a semiconductor formed between said first and second semiconductor layers, having a predetermined width and having an energy gap smaller than the energy gap of said first and second semiconductor layers, said active region having opposed edge surfaces serving as reflecting mirrors for oscillating a laser beam between said opposed edge surfaces and emitting a laser beam from one of said edge surfaces, thereby contributing to light emission;
   a pair of buried portions consisting of a semiconductor formed on and contiguous to opposite sides of said active region in the width direction thereof and having a greater forbidden band width than the energy gap of said active region;
   electric insulating regions formed on the opposite sides of said buried portions and between said first and second semiconductor layers; and
   first and second electrodes for supplying current to said active region; and
   said auxiliary mechanism including:
   a third semiconductor later made of the same material as the buried portions;
   a high resistivity layer provided on said third semiconductor layer; and
   an electrode take-out pad portion provided on said high resistivity layer and electrically connected to said first electrode of said semiconductor laser element.

2. The semiconductor laser device according to claim 1, wherein said high resistivity layer of said auxiliary mechanism is integrally connected to at least one side of said second semiconductor layer of said semiconductor laser element to mechanically support said semiconductor laser element.

3. The semiconductor laser device according to claim 2, wherein said auxiliary mechanism further includes an auxiliary mesa portion having said high resistivity layer, on which said pad portion is formed, said auxiliary mesa portion further having an electric insulating region formed between said high resistivity layer and said first semiconductor layer.

4. The semiconductor laser device according to said 3, wherein said electric insulating regions of said semiconductor laser element and said electric insulating region of said auxiliary mechanism are formed between said first and second semiconductor layers and said high resistivity layer and communicated with each other.

5. A semiconductor laser device comprising:
a substrate having a first semiconductor layer of a first conductivity type; and
a semiconductor laser element and an active element electrically connected to said semiconductor laser element, said eludents being formed side by side on said substrate;
said semiconductor laser element including:
a mesa portion having a second semiconductor layer of a second conductivity type provided above said first semiconductor layer;
an active region consisting of a semiconductor formed between said first and second semiconductor layers, having a predetermined width and having an energy gap smaller than the forbidden band widths of said first and second semiconductor layers, said active region having opposed edge surfaces serving as reflecting mirrors for oscillating a laser beam between said opposed edge surfaces and emitting a laser beam from one of said edge surfaces, thereby contributing to light emission;
a pair of burried portions consisting of a semiconductor formed on and contiguous to the opposite sides of said active region in the width direction thereof and having a forbidden band width greater than the energy gap of said active region;
electric insulating regions formed on the opposite sides of said buried portions and between said first and second semiconductor layers; and
first and second electrodes for supplying current to said active region.

6. The semiconductor laser device according to claim 5, wherein said active element has a transistor.

7. The semiconductor laser device according to claim 6, wherein said transistor has source and drain regions formed integrally with said first semiconductor layer of said semiconductor laser device and a gate region formed between said source and drain regions.

8. The semiconductor laser device according to claim 7, wherein said gate region has a semiconductor layer consisting of the same material as said second semiconductor layer of said semiconductor laser device and a gate electrode formed on said semiconductor layer.

9. The semiconductor laser device according to claim 8, wherein said transistor has source and drain electrodes formed on said substrate, and said second electrode of said semiconductor laser element is formed on said substrate in a spaced-apart relation to said source and drain electrodes.

* * * * *